United States Patent [19]

Cedrone, et al.

[11]  4,419,626

[45]  Dec. 6, 1983

[54] BROAD BAND CONTACTOR ASSEMBLY FOR TESTING INTEGRATED CIRCUIT DEVICES

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 296,234

[22] Filed: Aug. 25, 1981

[51] Int. Cl.³ ..................... G01R 1/06; G01R 31/02
[52] U.S. Cl. .............................. 324/158 P; 307/89; 324/72.5; 324/158 F; 339/108 TP
[58] Field of Search ............... 324/158 P, 158 F, 72.5; 339/108 TP; 307/89; 333/12

[56] References Cited

U.S. PATENT DOCUMENTS

| | | | |
|---|---|---|---|
| 3,705,439 | 11/1972 | McGahey et al. | 324/158 P |
| 3,832,632 | 8/1974 | Artezzone | 324/72.5 |
| 3,904,886 | 9/1975 | Ehling et al. | 307/89 |
| 4,068,170 | 1/1978 | Chayka et al. | 324/72.5 |
| 4,177,425 | 12/1979 | Lenz | 324/158 P |
| 4,270,019 | 5/1981 | Fhye et al. | 307/89 |

OTHER PUBLICATIONS

Daymarc "Integrated Circuit Sorter", Type 952/3, Condensed Bulletin and Interface Bulletin.
Daymarc "Integrated Circuit Sorter", Type 1152, Condensed Bulletin and Interface Bulletin.
"New Handler Simplifies Testing IC's at High Temps", Evaluation Engineering, May/Jun. 1976, pp. 10 and 12.
Daymarc "Integrated Circuit Sorter", Type 1152, High Temp and High/Low Temp, Condensed Bulletin.

Primary Examiner—Stewart J. Levy
Attorney, Agent, or Firm—Kenway & Jenney

[57]  ABSTRACT

A test contactor assembly for integrated circuit (IC) electronic devices and the like has at least one row of flexible contacts that are each secured at a lower end to a base. A conductive plate is also secured to the base and extends in a generrlly parallel, closely spaced relationship to each row of contacts. The dimensions of the plate and its spacing from the associated contacts produce a distributed capacitance with respect to each contact in the row such that a fast-rising test signal launched in a contact encounters a generally "characteristic" or purely resistive impedance that is frequency independent. A flexible insulating material is preferably located between the plate and its associated row of contacts to maintain the desired spacing as the plate and the contacts are flexed into electrical connection with associated pins of the device. For use with dual-in-line packaged (DIP) IC'S and Kelvin contacts, a pair of "inner" plates closest to the device carry pin contacts that can supply a large test current surge to the device. The inner plates are preferably connected to one another through a small capacitor and substantially reduce ground noise generated by current surges.

12 Claims, 6 Drawing Figures 4,419,626

BROAD BAND CONTACTOR ASSEMBLY FOR TESTING INTEGRATED CIRCUIT DEVICES

BACKGROUND OF THE INVENTION

This invention relates in general to testing apparatus for electronic devices. More specifically it relates to a contactor assembly that is generally frequency insensitive to allow broad band testing with fast-rising signals.

In the manufacture and use of integrated circuits (IC's) and similar electronic devices it is important to test the devices accurately, reliably and at a high rate. Automatic testing and handling apparatus machines that can perform this task are available. Such apparatus suitable for testing dual-in-line packaged (DIP) IC's are sold by the Daymarc Corporation, Waltham, Mass., under the trade designation Type 1156 and 1157. In a DIP device, the circuit is contained in a molded plastic body having a generally rectanguar, box-like configuration. Two rows of generally parallel connecting pins are arrayed along parallel sides of the body with each pin extending in a direction generally normal to the main faces of the body.

In each of the aforementioned apparatuses the IC's are momentarily brought to rest at a test station where a set of contacts, typically double Kelvin contacts, are flexed through a cam action into electrical connection with the pins of the device. The contacts establish an electrical connection between testing circuitry and the device. The contacts are usually part of a probe or contactor assembly which includes an insulating base member that mounts the contacts. The contacts are typically narrow strips of a resilient and highly conductive material. The contacts typically make electrical connection with an associated connecting pin at a free end opposite the base. The cross-sectional dimensions of the contacts are relatively small due to (1) the requirement that all of the contacts simultaneously make connection a set of closely packed pins and (2) the requirement that the contacts flex for millions of cycles of operation without material fatigue. The length of the contacts is determined by the spacing between the test station of the IC handling apparatus and the test circuitry.

Frequently the testing of the integrated circuits requires that the testing signal be "fast-rising", that is, a signal which is a very steep, step-like increase in potential. A typical fast-rising signal is characterized by a voltage change of 5 volts per nanosecond. Such a signal can be represented through Fourier analysis as being composed of a multitude of superimposed sine waves having a very high frequency, typically on the order of 300 mHz. The fast-rising signal launched by the test circuitry and carried by the contacts to the device therefore contains components with a very high frequencies.

A major problem with this testing arrangement is that due to the inherent inductance of the contacts themselves, the signal encounters an inductive reactance $X_L$. This reactance produces distortions and reflections which degrade the quality and accuracy of the test. The inductance L of the contact is a function of the cross-sectional area of the conductor and its length. It increases directly with the length and inversely with the cross-sectional area. Since the inductive reactance $X_L = 2\pi f L$, for the very high frequencies f associated with a fast-rising signal, the inductive reactance associated with even the relatively short contacts in normal use becomes a significant source of distortion and limits the accuracy of measurements.

One possible solution would be to increase the cross-sectional area of the contacts. However, the physical constraints of the test environment limit the useful dimensions of the contacts. For example, the contacts must be separated laterally from adjacent contacts while still maintaining a unique association with one pin on the IC. Also, the contacts must be sufficiently thin to flex repeatedly without exhibiting fatigue. Another possible solution is to make the contacts shorter. This solution works well if the IC can be placed manually into the test circuit. However, with high speed automated operation (e.g. 6,000 units per hour), the test circuitry must be physically separated from the device handling mechanisms with electrical connection made over some short distance spanned by a probe or contactor assembly of the type described above. In short, modern production economics require contacts having a length which is troublesome for fast-rising signals. Another solution is surrounding each contact with a shield in the manner of a coaxial cable. The shield, however, would interfere with the flexure of the enclosed contact. Still another possible solution is simply to test each device more slowly to wait for distortions and reflections to die out. With many modern IC's however, the speed of operation of the device itself is so fast that if the testing operation were to extend over a sufficient period of time to allow distortions and echoes induced by the fast-rising testing signal to subside, then the speed rating of the devices cannot be determined. In short, the testing operation must have a speed comparable to that of the device function being tested. At present, there is no known contactor assembly for use with automated IC testing and handling apparatus which can provide a reliable electrical connection between the IC device and the testing circuitry while at the same time avoiding the distortions, reflections and the resulting uncertainty of the measurement when the IC is tested with fast-rising signals.

Another consideration is minimizing "ground noise", that is, changes in the reference voltage due to current surges during the test procedure simulating operation of the device. A typical situation is a test where a change in the device state causes a current surge in the range of 20 milliamperes per nanosecond. Such a surge can cause the ground reference to move 1 volt or more thereby distorting measurements referenced to ground by 20% or more. The end result is that good devices may not pass the test and are downgraded.

It is therefore a principal object of this invention to provide a contactor assembly for testing electronic devices, particularly high speed IC's that presents substantially no inductive reactance to a fast-rising signal launched in any contact of the assembly.

Another object of the invention is to provide a contactor assembly with the foregoing advantage which is characterized by low signal distortion and reflection and a substantially resistive or "characteristic" impedance.

Yet another object of the invention is to provide a contactor assembly with the foregoing advantages which allows testing at high production speeds and with extremely high degrees of accuracy and hence certainty.

A further object of the invention is to provide a contactor assembly that can produce a test current surge originating very close to the device, presents a low inductance path for the surge to the device, and substantially reduces ground noise normally attendant such a surge.

A still further object of the invention is to provide a contactor assembly with the foregoing advantages that has a generally simple, low cost and highly durable construction.

SUMMARY OF THE INVENTION

A contactor assembly for electronic devices, particularly dual-in-line packaged (DIP) IC's with two parallel rows of connecting pins, has a base that supports at least one row of resilient electrical contacts secured at their lower end to the base and extending generally perpendicular to the base to a free end. Typically the free end is angled toward an associated pin to make electrical connection with the pin when the contact is fixed toward the device. Each contact has a small cross section and is designed to conduct an electrical signal along its length between test circuitry and the device. Each contact is structured to flex resiliently from a first non-testing position where the free end of the contact is spaced from the associated pin to a second testing position where the free end is forced into electrical connection with the pin.

The base also supports a conductive plate associated with and oriented in a generally parallel, closely spaced relationship with respect to each row of the contacts. The spacing is preferably uniform. In the preferred form, the plate is continuous and extends substantially the full length of the associated row. The plate is also preferably secured at one edge to the base and is resilient. The dimensions and spacing of the plate produce a distributed capacitance as seen by a signal transmitted along the contacts. The value of the resulting capacitive reactance substantially offsets the conductive reactance produced by the self inductance of the contacts. As a result, a fast-rising signal launched in a contact encounters a substantially characteristic impedance. Stated in other terms, the contactor assembly is substantially frequency independent and therefore capable of operating over a broad band.

The contactor assembly preferably includes a layer of flexible insulating material which is inserted between each of the upstanding plates and the associated row of contacts. The insulating layer maintains the desired dimensional separation between the plate and the associated contacts through the flexural movement of the contacts into and out of electrical connection with the pins. Also in the preferred form, the value of the characteristic impedance is generally in the range of 50 to 100 ohms.

Another feature of this invention is that at least one plate is located generally between the associated row of contacts and the device being tested. This "inner" plate carries a contact element structured and located to make electrical connection with one of the pins. In a preferred form of the invention adapted for use with devices having two parallel rows of pins, there are two such "inner" plates that make electrical connection with two different pins of the device. These plates and contacts provide a means located close to the IC for applying a large test current surge to it. The dimensions of the plates present a low inductance. One inner plate is connected to a source of a large current surge; the other plate is connected to ground. Both inner plates are connected to one another through a small capacitor that can be located either above or below the base.

These and other features and objects of the invention will be more clearly understood from the following detailed description of the preferred embodiments which should be read in light of the accompanying drawings.

DETAILED DESCRIPTION OF THE PREFERRED EMBODIMENTS

Figure 2:
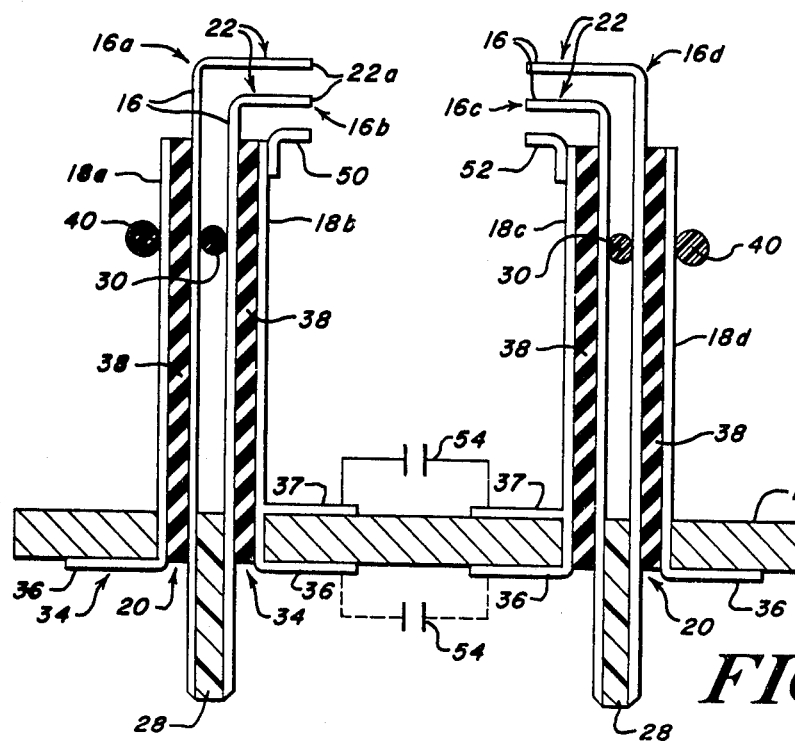
FIG. 2 is a view in vertical cross section of the contactor assembly shown in FIG. 1.

FIGS. 1-4 show a test contactor assembly 12 that has a base 14, four rows 16a, 16b, 16c and 16d of contacts 16, and a set of capacitive plates 18a, 18b, 18c and 18d that will be referred to collectively as plates 18. For the purpose of this description the base is taken as being horizontally oriented. It is also insulating and has a generally plate-like configuration. Each plate 18 is associated with one of the rows of contacts. Each contact 16 has a lower end 20 that is secured in the base 14 and extends to a free or upper end 22 that is angled toward an associated pin 24 of an integrated circuit device 26. The cross section of each contact 16 is preferably generally rectangular with the broad face of each contact parallel to the pins 24. As shown, the contacts in the rows 16a and 16b are arranged in Kelvin pairs with two contacts, 16' from the row 16b and 16" from the row 16a, adapted to make electrical connection with the same pin 24 at the same time. The contact 16" from the "outer" row 16a (the one more distant from the device) generally surrounds the contact 16 with the free end of the contact 16" overlying the free end 22 of the contact 16. Similarly, one contact from the row 16c and an associated, "overlying" contact from the row 16d form a Kelvin pair that maked an electrical connection with a pin on the opposite side of device 26. The pairs of contacts in the rows 16a and 16b are generally opposed to a like set of pairs of contacts in the rows 16c and 16d which allows the contact assembly 12 to make a reliably electrical connection to all of the pins of a DIP IC 26 of the type shown in FIGS. 3 and 4. The contacts in the rows 16a-16d are generally parallel to one another and to the rows of connecting pins 24 of the device 26.

The lower ends 20 of the paired contacts are spaced by insulating strips 28,28. In their normal unflexed position shown in FIGS. 1 and 2 the contacts are generally perpendicular to the base 14. In this position the ends 22 of the contacts are spaced from the pins 24. Besides being formed of a highly conductive material, the contacts 16 are also formed of a material which is resilient and resistant to material fatigue during cycled flexures to and from a testing position shown in FIGS. 3 and 4. In the flexed state, the end surfaces 22a of the free ends 22 make electrical connection to the associated pins 24. Spacer rods 30,30 are secured between the rows 16a and 16b and rows 16c and 16d. The rods 30,30 insure the desired spacing between the contacts during the flexural movement developed by a lateral force (typically delivered by a cam, not shown) applied in a direction indicated by the arrows 32,32 in FIG. 3.

A principal feature of the present invention is the set of conductive plates 18a–18d each of which is associated with one row of the contacts 16. The plates 18a–18d are preferably generally rectangular and are secured at a lower edge 34 to the base 14 with the edge passing through a suitable opening in the base 14. A flanged portion 36 of each plate extends under and is generally parallel to the base 14 provides an electrical connection site to ground (for plates 18a and 18d). The inner plates 18b and 18c also preferably have a flange-like portion 37 that is generally similar to the flange 36 except that it extends along the upper surface of the base 14. The flanges 37,37 provide electrical connection to ground for the plate 18c and to a source of a large current surge for the plate 18b. The plates are formed of a conductive sheet material that is resilient and has a substantially uniform thickness. Each of the plates is also oriented so that it is substantially parallel to the associated row of contacts and is closely spaced therefrom at a substantially constant distance. The plates extend vertically over substantially the full length of the contacts with a small clearance between the upper edge of the "inner" plates 18b and 18c and the overlying upper portions 22 of the "inner" rows of contacts 16b and 16c. Each plate extends laterally at least the full length of the row of contacts with which it is associated. For any contact, the associated plate is an approximation to a parallel plate with unlimited dimensions.

In the preferred form shown, a thin layer 38 of a flexible insulating material such as a fluoroplastic maintains each plate at the preselected spacing from the associated row of contacts. The layers 38 should have a sufficient Shore hardness that the lateral flexural force (in direction of the arrows 32,32) does not compress the layers 38 to any significant degree and thereby substantially reduce the spacing between the plates and their associated rows of contacts. On the other hand, the layers 38 should be sufficiently flexible not to impede significantly the flexural movement. Similarly, the plates themselves should be sufficiently flexible that they do not significantly impede flexural movement under the lateral flexing force applied through insulating rods 40,40 held at the outer face of the plates 18a and 18d at a point aligned with the rods 30,30. The layers 38 preferably extend substantially the full height of the plates to provide a generally uniform dielectric constant between the plates and the associated rows of contacts. The plate-contact spacing can also be maintained by other means such as small, non-resilient spacer elements with air as the principal insulating medium.

Each contact conducts a signal along its length from a connection point to a testing circuit at its lower end 20 adjacent the spacer 28 to its end 22 in contact with the associated pin 24 of the IC 26. As with any conductor, each contact has a characteristic inductance L which is a function of its cross-sectional area and length. For a conductor having a generally rectangular cross section such as the contacts 16 the inductance is a function of the thickness of the contacts (measured generally in the direction of the arrows 32,32), the width W of the contacts (measured along the direction of the rods 30,30) and the length l of the contact. When a fast-rising signal is launched the contact contacts having any significant length (a typical length being approximately one inch) will generate an inductive reactance $X_L$ which is equal to $2\pi f L$. The precise inductive impedance generated will, of course, depend upon the configuration of the conductor and the exact nature of the fast-rising signal. Since, as noted above, a fast-rising signal can be analyzed as a collection of waves having an extremely high frequency (a typical frequency being 300 mHz) even the extremely small inductance of a contact 16 can produce a sufficient inductive reactive to introduce distortions and reflections in the transmitted signal.

Figure 5:
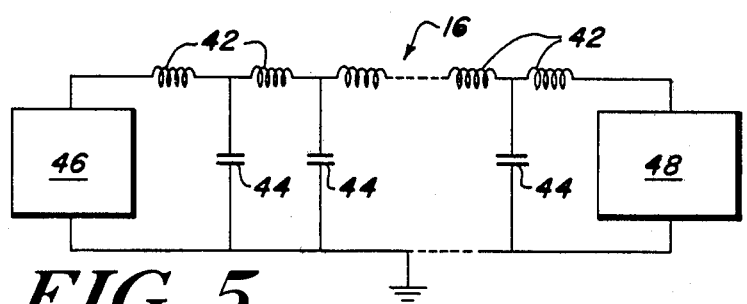
FIG. 5 is a circuit schematic for one contact and its associated plate.

The plates of the present invention neutralize this inductive reactance by providing a distributed capacitance along the length of the contacts. This equivalent circuit for a single contact is shown in FIG. 5 where a contact 16 is represented as a series of inductors 42 and the distributed capacitance between the contact and the associated plate is represented as a series of capacitors 44 connected between the inductors 42 and ground. The signal source or test circuitry 46 is connected at one end of the circuit and the IC 26, represented as a load 48, is connected at the opposite end. Utilizing conventional transmission line theory and formulas for calculating inductance and capacitance of the contacts 16 and associated plates 18, for a given contact and a given test signal, it is possible to calculate the plate-contact spacing and that will produce a distributed capacitance whose capacitive $X_c$ offsets the phase shift of the inductive reactance $X_L$. As a result, the fast-rising signal transmitted by the contacts 16 encounter a "characteristic" impedance $Z_o$, that is substantially resistive. That is, there is no net phase shift between the current and voltage due to capacitive or inductive elements in the transmission line. The impedance $Z_o$ is, therefore, substantially independent of the frequency of the signal and the test contactor assembly 12 is broad band.

Typically the IC's 26 are tested in systems where the impedance of the contactor assembly is either 50 ohms or 100 ohms. The contactor assembly 12 of the present invention therefore preferably has plates 18a–18d that are structured and located with respect to the contacts 16 to produce a characteristic impedance with one of these values. The value of $Z_o$ in ohms is given by the square root of L/C. Of course, the inductance of the contacts or the capacitance introduced by the plates 18 can be designed to produce a value for the characteristic impedance encountered by the signal which is less than 50 ohms, more than 100 ohms, or at some intermediate value.

While calculations can provide a reasonably good indication of performance, particularly when the elements are rigid and fixed and the insulating medium is air, for the contactor assembly of this invention trial and error adjustments will usually be required to arrive at a configuration that produces the desired characteristic impedance. It should be noted that because pairs of contacts forming a Kelvin contact are connected to the same pin and carry the same signal, as a practical matter the capacitance between the pair is not significant. However, the capacitance between laterally adjacent contacts is important. To reduce this capacitance, it may be preferable for certain applications to use a single contact for each pin rather than a Kelvin pair. For a typical Kelvin contact assembly of the type used in testers/handlers manufactured by Daymarc Corporation, and for use with fast rising signals that have a change in potential of 5 volts over 1 nanosecond, it has been found that a plate-contact spacing of approximately 0.014 inch produces the desired response.

Another significant feature of the contactor assembly according to the present invention is that the inner plates 18b and 18c include pin contact elements 50 and 52, respectively, mounted on their faces adjacent the IC 26 and positioned to make contact with an associated pin 24 of the IC. The contacting elements 50 and 52 are L-shaped conductors which are welded or brazed onto the inner plates. They are useful for testing the operation of the IC in response to a large current surge. One of the inner plates, such as the plate 18b, is preferably connected to a source of a suitable large current surge (such as a capacitor, not shown) which can be applied to the IC through the plate 18b and the contact 50. It should be noted that due to the large dimensions of the plate 18b as compared to a single contact 16, the inductive impedance problems usually associated with a large current surge are minimized. The contact 52 is connected through the plate 18c to ground, as are the plates 18a and 18d.

Figure 6:
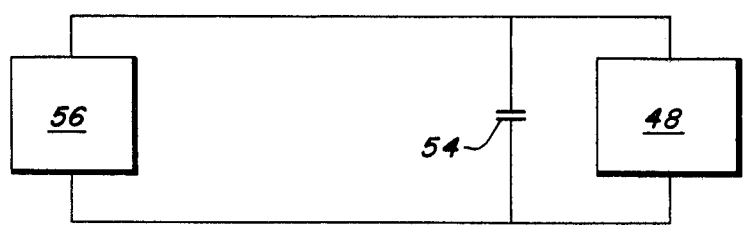
FIG. 6 is a circuit schematic for the inner capacitive plates as shown in FIGS. 1-3.

The plates 18b and 18c are also connected to one another through a small capacitor 54. The function of the capacitor 54 is best seen with reference to FIG. 6. The source of the large current is represented by the reference numeral 56, the source of the surge by the capacitor. The IC appears as a load with the capacitor 54 connected in parallel with the load. Because the impedance is low for high frequencies, the capacitor presents a very low impedance to ground. As a result, even though the plate 18b is connected to a high voltage source, for fast-rising signals it acts as though it is at ground. Another advantage of this arrangement is that it provides a source for a large current surge that is located very close to the device being tested. This also results in reductions in distortions in the transmission and increases the accuracy of the test results.

Figure 1:
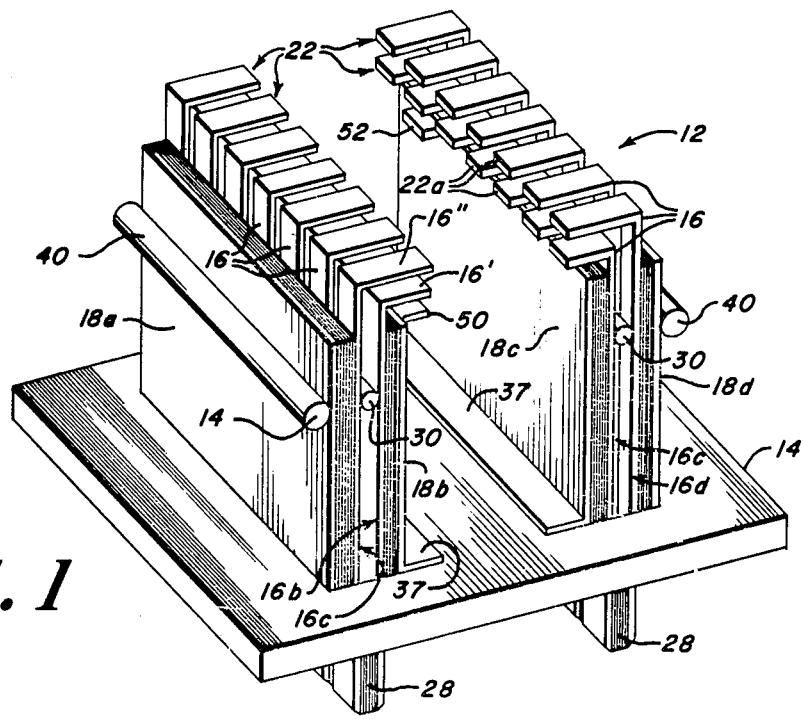
FIG. 1 is a perspective view of a broad band contactor assembly constructed according to the present invention and utilizing two opposing rows of double Kelvin contacts suitable for testing a DIP IC's.
Figure 3:
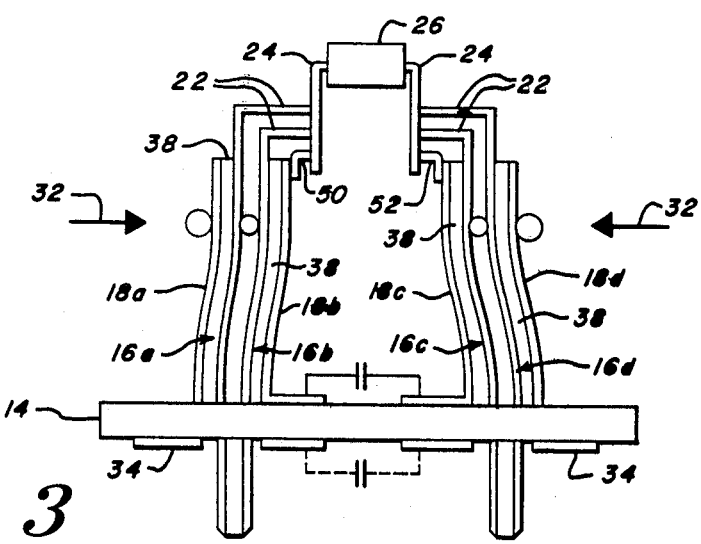
FIG. 3 is a simplified view corresponding to FIG. 2 showing the contacts and the associated capacitive plates flexed into a position where the contacts are in electrical connection with a device being tested.
Figure 4:
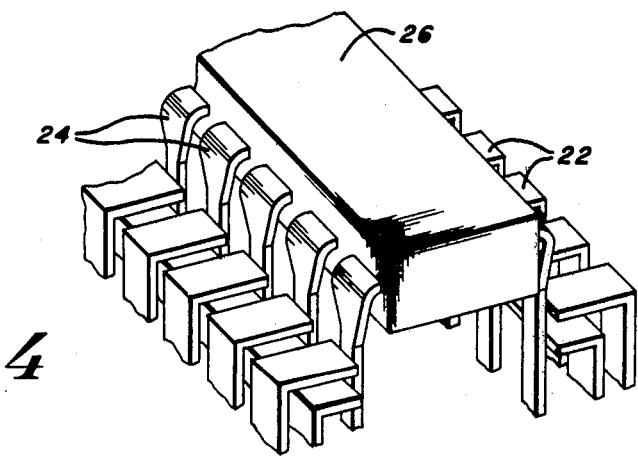
FIG. 4 is a detailed perspective view of the free ends of the contacts making electrical connection with a representative IC as shown in FIG. 3.

The capacitor 54 is shown in FIGS. 1 and 3 as connected between the flanges 37 and located at the upper surface of the base 14. This location has the advantage of placing the capacitor 54 very close to the IC 26. However, in certain test situations it is necessry to plate the IC and components near the IC in a temperature environment that adversely affects the capacitor. In these instances, the capacitor 54 can be connected between the flanges 36,36 of the plates 18b, 18c located at the under side of the base 14 (shown in phantom). This location provides temperature isolation for the capacitor 54 without significantly increasing the distance between the IC and the capacitor.

While the invention has been described with reference to its preferred embodiment, we understood that various modifications and alterations will occur to those skilled in the art from the foregoing detailed description and the drawings. For example, while the invention has been described with respect to continuous plates the capacitive function of the plates can be performed by a series of conductive strips which are each associated with the contacts or by non-rectangular plates which are not necessarily continuous. Further, while the plates 18 have been described generally resilient members that are secured at one edge to the base 14, it is possible to produce the desired operating characteristics of the present invention utilizing substantially generally inflexible plates and plates which are not secured to the base. One embodiment could utilize a plate which is fastened by an adhesive to the associated layer 38 but is not directly secured to the base 14. These and other modifications and variations which will occur to those skilled in the art are intended to fall within the scope of the appended claims.

What is claimed is:

1. In a contactor assembly for electronic devices with a plurality of connection pins arrayed in at least one row, said assembly having a base, and a plurality of contacts each secured at a first end to the base and extending from the base to a second end and adapted to conduct an electrical signal to an associated pin of the device, said contacts being structured to flex resiliently from a first position where said second ends are spaced from said pins to a second position where said second ends are in electrical connection with said pins, the improvement comprising conductive plate means secured in a closely spaced, generally parallel relationship with said at least one rows of contacts, the dimensions of said plate means and said spacing producing a distributed capacitance such that the capacitive reactance induced by the presence of said plate means generally offsets the inductive reactance of said contacts and thereby present a generally characteristic impedance to said signal over a broad band.

2. The improvement according to claim 1 further comprising means to maintain a generally uniform spacing between said contacts and said plate means during said flexure movement between said first and second positions.

3. The improvement according to claim 2 wherein said spacing maintenance means comprises a layer of a flexible insulating material.

4. The improvement according to claim 1 wherein said contacts are double Kelvin contacts arrayed in four generally parallel rows and uniformly spaced along the direction of said rows, and wherein said plate means comprises an inner and outer plate associated with each row of said Kelvin contacts.

5. The improvement according to claim 2 wherein said plate means is located generally between said pins and said contacts and further comprising contact means secured to said plate means and adapted to establish an electrical connection with one of the pins when said contacts are in said second position.

6. The improvement according to claim 5 wherein said assembly has at least two parallel rows of said contacts and the associated plate means each are adapted to establish said electrical connection with a different one of said pins.

7. The improvement according to claim 6 wherein said plate means are electrically connected to one another through a small capacitor.

8. The improvement according to claim 1 wherein said characteristic impedance has a value generally in the range of 50 to 100 ohms.

9. A contactor assembly for testing electronic devices that are packaged with a dual-in-line pin array comprising, a base formed from an insulating material,
    a plurality of double Kelvin contacts arrayed in two generally parallel rows with a lower end of each contact secured to said base and an upper end adapted to make electrical connection with one of the pins, each of said contacts being flexible to move between a first position where said upper ends are spaced from said pins and a secod position where said upper ends are in electrical connection with said pins, each of said contacts being adapted to conduct an electrical signal along its length to an associated pin of the device, two pairs of inner and outer flexible, conductive plates each secured at a lower edge to said base and each spaced closely from one row of said contacts, the dimensions of said plates and said spacing producing a distributed capacitive reactance in said contacts produced by the presence of said plates that generally offsets the inductive reactance produced by said signal in said contacts whereby said signals encounter a generally characteristic impedance over a broad band, and a plurality of flexible insulating layers disposed between said plates and their associated row of contacts that substantially maintain said spacing during said movement.

10. The contactor assembly according to claim 9 wherein said inner plates are each adjacent the device and further comprising means for establishing an electrical connection with two different pins of the device, said connection means being mounted on said inner plates.

11. The contactor assembly according to claim 10 wherein said inner plates are connected to one another through a small capacitor.

12. The contactor assembly of claim 9 wherein said inner plates each include a flange that extends generally along the upper surface of said base and said capacitor is electrically connected between said flanges.

* * * * *